(12) United States Patent
Yavelberg

(10) Patent No.: US 9,384,122 B2
(45) Date of Patent: Jul. 5, 2016

(54) HIGH SAMPLING RATE SENSOR BUFFERING IN SEMICONDUCTOR PROCESSING SYSTEMS

(71) Applicant: Applied Materials, Inc., Santa Clara, CA (US)

(72) Inventor: Simon Yavelberg, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 436 days.

(21) Appl. No.: 13/911,405

(22) Filed: Jun. 6, 2013

(65) Prior Publication Data

US 2013/0332682 A1 Dec. 12, 2013

Related U.S. Application Data

(60) Provisional application No. 61/658,622, filed on Jun. 12, 2012.

(51) Int. Cl.
*G06F 12/00* (2006.01)
*G01D 9/00* (2006.01)
*H01L 21/67* (2006.01)

(52) U.S. Cl.
CPC ............... *G06F 12/00* (2013.01); *G01D 9/005* (2013.01); *H01L 21/67253* (2013.01)

(58) Field of Classification Search
None
See application file for complete search history.

(56) References Cited

U.S. PATENT DOCUMENTS

| 7,332,929 | B1* | 2/2008 | Normoyle | G01R 31/3177 326/16 |
|---|---|---|---|---|
| 2004/0027872 | A1 | 2/2004 | Nishikawa et al. | |
| 2008/0252481 | A1* | 10/2008 | Vacar | H04Q 9/00 340/870.38 |
| 2010/0014748 | A1* | 1/2010 | Reath | H01L 21/67253 382/149 |

FOREIGN PATENT DOCUMENTS

| JP | 2008-046012 A | 2/2008 |
|---|---|---|
| KR | 2008-0048483 A | 6/2008 |
| KR | 2008-0087427 A | 10/2008 |
| KR | 2012-0024686 A | 3/2012 |

OTHER PUBLICATIONS

International Preliminary Report on Patentability dated Dec. 16, 2014 for International Application No. PCT/US2013/04453, 5 pages.
International Search Report and Written Opinion dated Aug. 27, 2013 for International Application No. PCT/US2013/04453, 8 pages.

* cited by examiner

*Primary Examiner* — Idriss N Alrobaye
*Assistant Examiner* — Dayton Lewis-Taylor
(74) *Attorney, Agent, or Firm* — Kilpatrick Townsend & Stockton LLP

(57) ABSTRACT

Embodiments of the invention are directed toward systems and/or methods that buffer data from various sensors with a high sampling rate in a semiconductor processing system. Such sampling can provide better data about the processing for diagnosing the conditions leading up to a processing fault in the system.

20 Claims, 5 Drawing Sheets

HIGH SAMPLING RATE SENSOR BUFFERING IN SEMICONDUCTOR PROCESSING SYSTEMS

CROSS-REFERENCES TO RELATED APPLICATIONS

This application claims the benefit of U.S. Prov. Pat. App. No. 61/658,622 filed Jun. 12, 2012, and titled "High Sampling Rate Sensor Buffering in Semiconductor Processing Systems," which is entirely incorporated herein by reference for all purposes.

BACKGROUND OF THE INVENTION

Semiconductor processing systems are complex systems that perform a variety of complex processes. Because of the complexity of the systems and/or processes faults can occur for any number of reasons related to either hardware or software malfunction.

BRIEF SUMMARY OF THE INVENTION

The terms "invention," "the invention," "this invention" and "the present invention" used in this patent are intended to refer broadly to all of the subject matter of this patent and the patent claims below. Statements containing these terms should not be understood to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to the entire specification of this patent, all drawings and each claim.

Embodiments of the invention are directed toward systems and/or methods that buffer raw data received from one or more sensors with a high sample rate in a semiconductor processing system. Such sampling can provide better data about the cause of a fault in the semiconductor processing system. Some embodiments of the invention include a semiconductor processing system with a plurality of sensors that measure various processing conditions, a buffer coupled to at least a subset of the plurality of sensors, and a long term storage device coupled with the buffer. The buffer can be used to collect raw data from the subset of sensors at a high sampling rate.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE DRAWINGS

These and other features, aspects, and advantages of the present disclosure are better understood when the following Detailed Description is read with reference to the accompanying drawings.

Illustrative embodiments of the present invention are described in detail below with reference to the following drawing figures.

DETAILED DESCRIPTION OF THE INVENTION

The subject matter of embodiments of the invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Semiconductor manufacturing systems can fail due to hardware or software malfunction. Many faults can be hard to troubleshoot because some information, such as a given sensor's state can be lost at the time of the fault. Depending on the fault, sensor information can be useful in diagnosing the cause of the fault. Embodiments of the invention can be used to buffer sensor data at a high sample rate to ensure sensor information is available to diagnose the fault.

Embodiments of the invention are directed toward systems and/or methods that buffer data from various sensors with a high sampling rate in a semiconductor processing system. Such sampling can provide better data about the processing for diagnosing the conditions leading up to a processing fault in the system.

Figure 1:
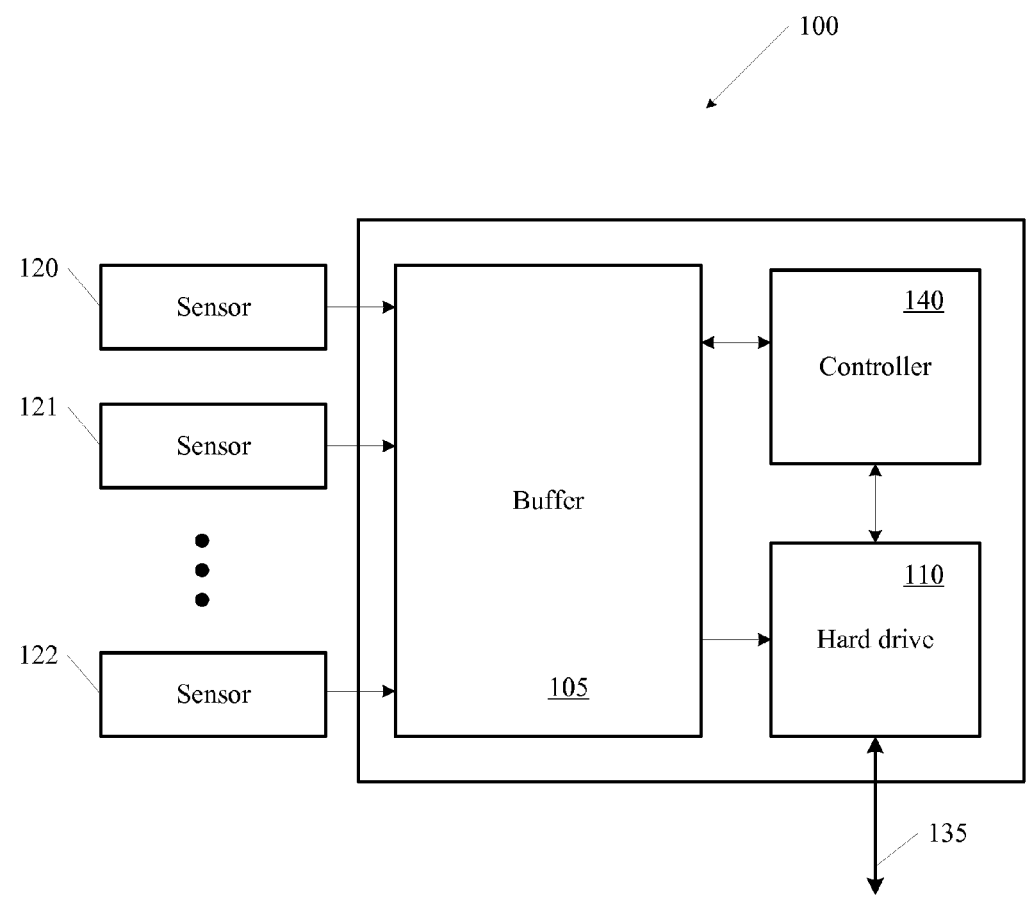
FIG. 1 is a block diagram of a Sensor system according to some embodiments of the invention.

FIG. 1 shows a block diagram of sensor system 100 according to some embodiments of the invention. Sensor system 100 can be used, for example, in any processing system; for example, semiconductor processing systems, solar array processing systems, display processing systems, battery processing systems, etc. As other examples, sensor system 100 can be used in various stages or portions of a processing system such as in front-of-the-line processes, deposition processes, removal processes, etching processes, patterning processes, modification processes, three dimensional printing processes, back-of-the-line processes, wafer testing, among others. For example, depositions processes can include physical vapor deposition (PVD), chemical vapor deposition (CVD), electrochemical deposition (ECD), molecular beam epitaxy (MBE), and/or atomic layer deposition (ALD) systems among others. Removal processes, for example, can include wet etching, dry etching, and/or chemical-mechanical planarization (CMP) among others. Patterning processes, for example, can include conventional lithography, photolithography, stepper processes, and/or plasma ashing among others. Modification processes, for example, can include doping processes, thermal oxidation, and/or annealing (including rapid thermal annealing among others.

Sensor system 100 can include buffer 105 coupled with hard drive 110. Buffer 105 can include inputs that can be electrically connected with a sensor such as, for example, sensor 120, sensor 121, and/or sensor 122. Connectors can also be used to connect one or more sensors with one or more buffer inputs. Controller 140 can be used to control operation of buffer 105 and/or hard drive 110.

Buffer 105 can be any memory that temporarily stores sensor data prior to being stored in hard drive 110. Buffer 105 can comprise any type of memory device, such as, for example, RAM. Buffer 105 can comprise a single buffer coupled with a plurality of sensors, or a single a buffer coupled with a single sensor. Moreover, buffer 105 can include a plurality of buffers each of which are coupled with one of a plurality of sensors.

In some embodiments, in operation, buffer 105 can store raw sensor data, which may be digitized. This raw sensor data may or may not include processing information. Buffer 105 may also store a counter or timing data within buffer 105. Processing information can the data collection time, date information, sensor information, processing system information, tool information, processing recipe information, fabrication information, processing location, operator information, data units, etc. When the raw sensor data is written to hard drive 110, the sensor data can be stored in conjunction with any or all processing information.

Moreover, when the raw sensor data is written to hard drive 110, the raw sensor data can be formatted to a predetermined or selectable formatting style. Often sensors produce raw sensor data as a voltage, resistance, or other raw value. In such cases, the raw sensor data may be converted from the raw value to a physically meaningful value using an equation and/or a table. For example, a temperature sensor may include a thermocouple that produces a voltage. In operation, the voltage of the thermocouple can be sampled and stored in buffer 105 at a high sampling rate. Controller 140 can convert the voltage value stored in buffer 105 to a temperature value using an equation and/or table.

In operation, buffer 105 can store raw sensor data from one or more sensors at a rate that is faster than one hundred bits per microsecond, ten bits per microsecond or one bit per microsecond. This sampling rate of buffer 105, for example, can be a higher than the sampling rate of hard drive 110. Various other components can be included in Sensor system 100; for example, an analog to digital converter(s) can be disposed between sensors and buffer 105 to digitize analog sensor data.

For example, buffer 105 may include two buffers each of which are assigned to separate sensors. For example, one buffer may buffer data from a temperature sensor and another may buffer raw data from a flow sensor. In embodiments with a plurality of sensors a plurality of buffers may be used.

In other embodiments, a single buffer may be used. For example, a temperature sensor and a flow sensor may be coupled to the single buffer. The raw temperature sensor data may be stored in a first buffer location as a raw resistance value and the raw flow data may be stored at a second buffer storage location as a raw voltage value. In some embodiments, when writing the buffered data to hard drive 110, the raw resistance value can be converted to temperature prior to being stored in the hard drive using controller 140. In other embodiments, the raw value can be stored in hard drive 110.

In some embodiments raw sensor data may also be stored in the hard drive with a time stamp (or counter) that associates the data or each data element to the time the data was collected based, for example, on the time the data started being recorded, the number of samples buffered, and the sampling rate. Any of the other processing information, described above or otherwise, may also be stored in the hard drive along with the sampled data. Furthermore, the raw data may be formatted, for example, to fit within a table, to have a specific length in bits or bytes, marked up, assigned some type of informational tag, etc.

In some embodiments, buffer 105 can write data collected from the sensors to the hard drive while the processing system is operating. In other embodiments, buffer 105 can collect data continuously and write the collected data to the hard drive after a fault has been detected. In this embodiment, while data is being collected, older data is being deleted from the buffer. To ensure enough data is collected, buffer 105 may be required to have sufficient memory to capture and buffer the collected data for a required period of time, for example, 5, 10, 15, 20, 25, 30, 35, 40, 45, 50, 55, or 60 minutes. Regardless, in some embodiments, at some point data stored in buffer 105 from one or more sensors can be stored in hard drive 110.

Hard drive 110 can include any type of long term storage device. For example, hard drive 110 can comprise a storage server, RAM, cloud storage, etc.

The sensors, sensor 120, sensor 121, and/or sensor 122, can include any type of sensor. For example, one or more sensor can measure atmospheric conditions within a processing chamber such as temperature, humidity, or pressure. As another example, one or more sensors can measure gas flows into and/or out of the process chamber, DC power to the chamber, DC power within the chamber, RF power within the chamber, current draw, etc. As another example, one or more sensors can measure the position and/or movement of various components such as substrate support structures, substrate carriers, and/or other tooling components. Moreover, as another example, sensors can measure the torque and/or speed of various motors. As yet another example, one or more sensors can measure any of various environmental conditions such as heat, radiation, sounds and/or vibrations. As another example, one or more sensors can sense the pressure, flow, temperature, and/or amount of chemicals and/or gases within the processing chamber, within conduits, and/or within tanks. As yet another example, one or more sensors can measure various processing conditions such as wafer thicknesses, wafer sizes, wafer uniformity, wafer polishing etc. Various other sensors can be used without limitation.

Sensor system 100 may also include output 135 that can be used to provide the sensor information. This can be done by any technique known in the art; for example, the data can be emailed to an engineer or scientist of the facility or manufacturer. As another example, the data can be stored in a file located at a computer system or at a cloud storage location. The data can then be accessed by an operator, engineer or scientist through a computer network (e.g., the Internet).

Figure 2:
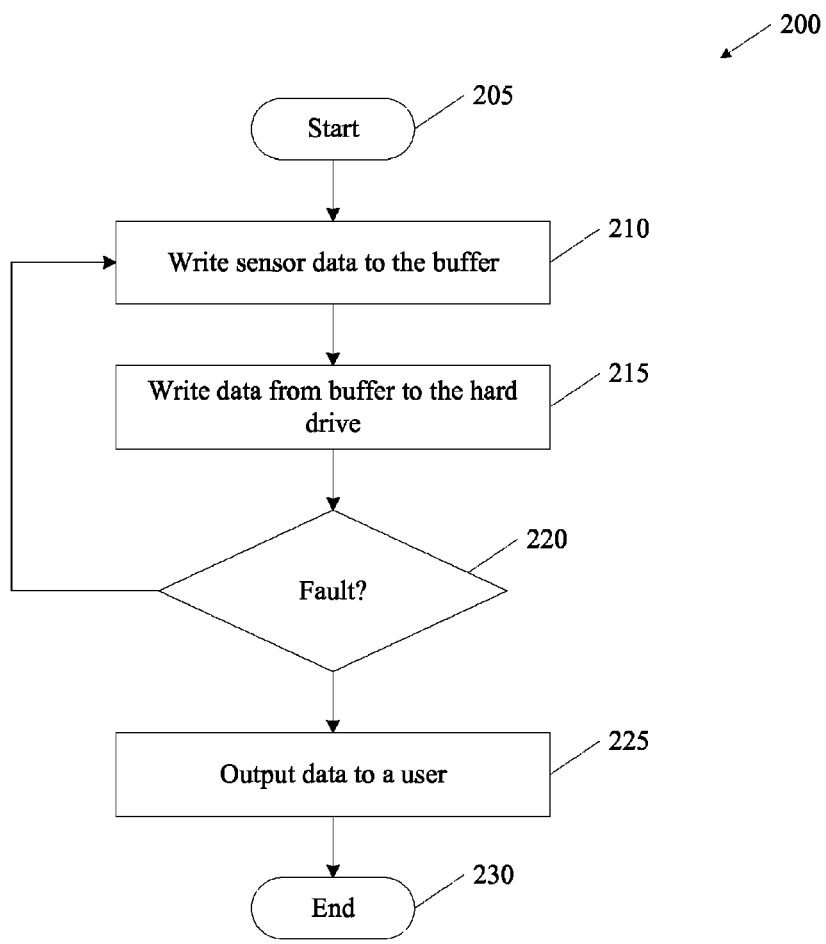
FIG. 2 is a flowchart of a process for buffering sensor data according to some embodiments of the invention.

FIG. 2 shows a flowchart of process 200 for buffering sensor data according to some embodiments of the invention. Process 200 begins at block 205. At block 210 sensor data can be written to the buffer. This sensor data can be collected from at least one of multiple sensors (e.g., sensors 120, 121, and/or 122). This sensor data can be written to the buffer with fast sample rates. At block 215 data from the buffer can be written to a hard drive. This can occur at a rate slower than the rate that the data is written to the buffer from the sensors, and/or some data can be written to hard drive 110 while other data is being written to buffer 105.

At block 220 it can be determined if a fault has occurred. This can happen in a number of ways. For example, an engineer managing the processing system (or any other worker) can manually determine a fault has occurred, or the processing system can determine a fault has occurred based on data from one or more sensors within the system. If no fault is determined, then process 200 returns to blocks 210 and 215.

If a fault is determined, regardless of how it is determined, process 200 proceeds to block 225 and the data recorded in the hard drive is output to a user. This can be done in any number of ways. In some embodiments it may be required to wait for the data to be written from the buffer to the hard drive before outputting the data to a user to ensure all the data has been written to the hard drive. Process 200 can end at block 230.

Figure 3:
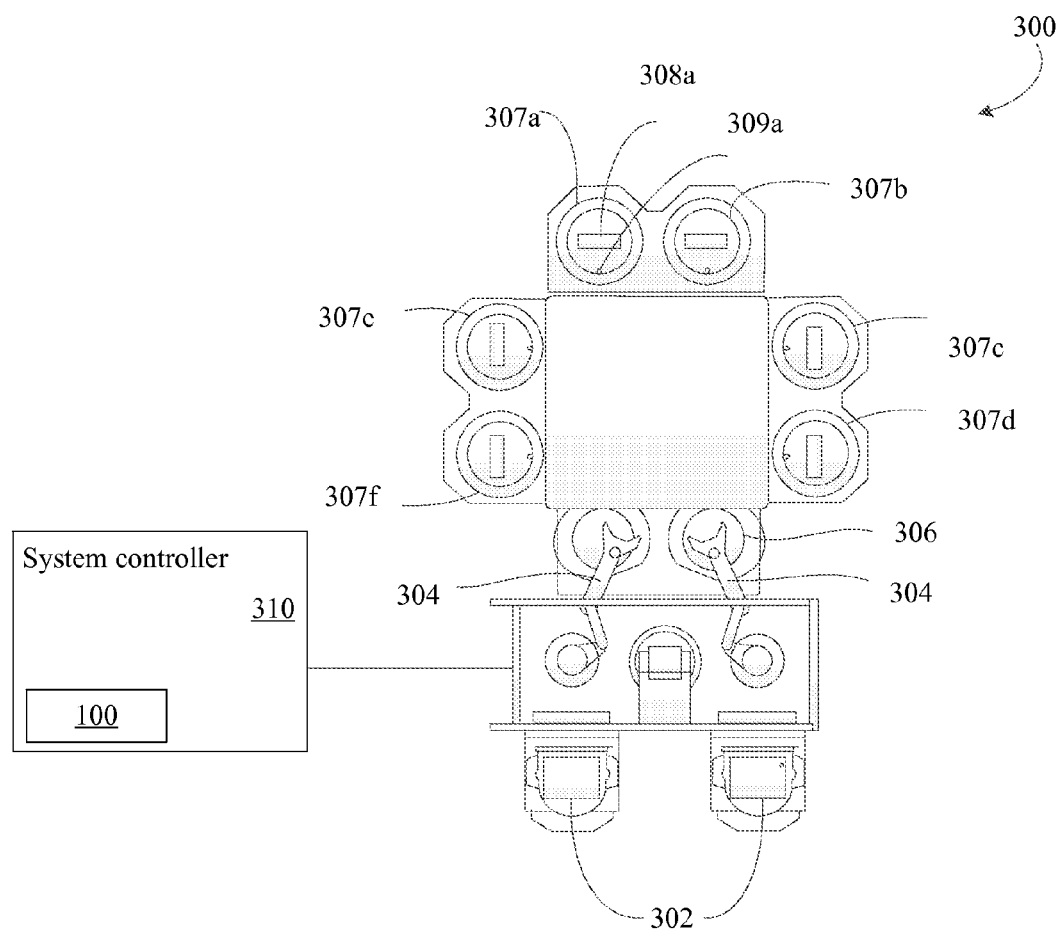
FIG. 3 illustrates an example arc detection system according to some embodiments of the invention.

FIG. 3 shows an example of a processing system 300 that may be used in embodiments of the invention. Processing system 300 may include a pair of FOUPs (front opening unified pods) 302 to supply substrates (e.g., 300 mm diameter wafers) that are received by robotic arms 304 and placed into a low pressure holding area before being placed into one of the wafer processing chambers 307a-f. Each processing chamber 307a-f can be outfitted to perform a number of substrate processing operations including the remote plasma processes described herein in addition to cyclical layer deposition (CLD), atomic layer deposition (ALD), chemical vapor deposition (CVD), PVD, etch, pre-clean, degas, orientation and other substrate processes.

The processing chambers 307a-f may include one or more system components for depositing, annealing, curing and/or etching on the substrate wafer. In one configuration, two pairs of the processing chamber (e.g., 307c-d and 307e-f) may be used to deposit dielectric material on the substrate, and the third pair of processing chambers (e.g., 307a-b) may be used to etch the deposited dielectric. In another configuration, all three pairs of chambers (e.g., 307a-f) may be configured to provide an etching process on the substrate. Any one or more of the processes described may be carried out on chamber(s) separated from the fabrication system shown in different embodiments.

Each processing chamber (e.g., 307a) may include a substrate support (e.g., 308a) configured to support a substrate within a processing chamber during a process. For example, substrate support 308a may be an electrostatic chuck (ESC) which holds and supports the substrate within the processing chamber 307a. In addition to a substrate support, each processing chamber (e.g., 307a) may also include at least one sensor (e.g., 309a) configured to measure one or more critical parameters associated with a substrate processing that takes place within the processing chamber (e.g., 307a) to generate an analog output signal representative of the measured parameters.

System controller 310 is used to control motors, valves, flow controllers, power supplies and other functions required to carry out process recipes by the processing system. System controller 310 may rely on feedback from optical sensors to determine and adjust the position of movable mechanical assemblies in processing chambers 307a-f. Mechanical assemblies may include the robot, throttle valves and susceptors which are moved by motors under the control of system controller 310. System controller 310 can include sensor system 100.

In some embodiments, system controller 310 includes memory (e.g., a hard disk drive), input and output ports, and a processor. System controller 310 may include analog and digital input/output boards, interface boards, and stepper motor controller boards. Various parts of multi-chamber processing system are controlled by system controller 310. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

Figure 4:
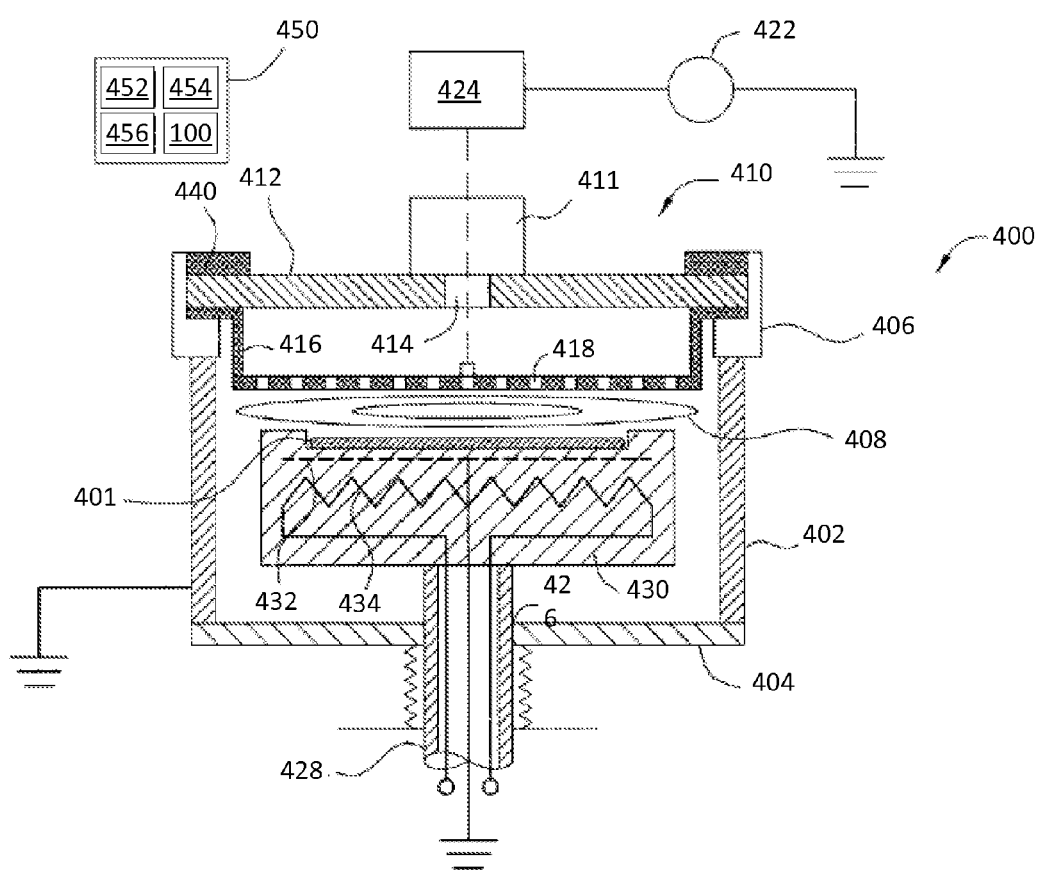
FIG. 4 illustrates another example arc detection system according to some embodiments of the invention.

Processing chamber (e.g., 307a) can be any type of processing chamber. One example is a PECVD chamber shown in FIG. 4. PECVD chamber 400 includes sidewalls 402, a bottom wall 404, and a chamber lid 406, which cumulatively define a processing region 408. A gas distribution system 410 is disposed through the chamber lid 406 to deliver gases into the processing region 408. The gas distribution system 410 includes a gas box 412 with a gas inlet 414 that receives processing gases from a precursor source 411 and that introduces processing gases into the gas box 412. The gas distribution system 410 also includes a showerhead 416 having a plurality of gas passages 418 for distributing the processing gases from the gas box 412 into the processing region 408. The gas distribution system 410 may also include a gas box heater 420, such as a ring-shaped, resistive heater, to heat processing gases to a desired temperature.

The showerhead 416 is coupled to an RF power supply 422 to provide electrical energy to the showerhead 416 to facilitate plasma formation in the processing region 408. Thus, the showerhead 416 acts as an upper, powered electrode. An auto-tuned RF matching network 424 is positioned between the RF power supply 422 and the showerhead 416. In one embodiment, the RF power is supplied at a frequency of about 23.56 M Hz.

The bottom wall 404 defines a passage 426 for a stem 428 that supports a pedestal heater 430. The pedestal heater 430 is configured to support a substrate 401 in the processing region 408. The pedestal heater 430 includes a ground mesh 432 embedded therein, which is connected to an RF ground. Thus, the ground mesh 432 acts as a ground electrode to facilitate plasma formation in the processing region 408 between the showerhead 416 and the pedestal heater 430. The pedestal heater 430 also includes one or more heating elements 434, such as resistive heating elements, to heat the substrate 401 to a desired processing temperature.

A control system 450, including a central processing unit (CPU) 452, a memory 454 and support circuits 456, is coupled to the various components of the chamber 400 to facilitate control of processing within the chamber 400. The memory 454 can be any computer-readable medium, such as random access memory (RAM), read only memory (ROM), floppy disk, hard disk, or any other form of digital storage, local or remote to the chamber 400 or CPU 452. The support circuits 456 are coupled to the CPU 452 for supporting the CPU 452 in a conventional manner. These circuits include cache, power supplies, clock circuits, input/output circuitry and subsystem, and the like. A software routine or a series of program instructions store in the memory 454, when executed by the CPU 452, causes the chamber 400 to perform plasma processes therein. Control system 450 may also include sensor system 100.

Deposition chambers that may benefit from the present invention include chambers configured to deposit oxides, such as carbon-doped silicon oxides, silicon containing films, and other dielectric materials including advanced patterned films (APF). An example of a deposition chamber is the PRODUCER™ chamber available from Applied Materials, Inc. of Santa Clara, Calif. The PRODUCER™ chamber is a PECVD chamber with two isolated processing regions that may be used to deposit carbon-doped silicon oxides and other materials. An example of a chamber is described in U.S. Pat. No. 5,855,681, which is incorporated herein by reference in its entirety. Although the chamber 400 is schematically depicted as a PECVD chamber, use of the invention may be equally affective on other chambers, such as plasma etch, PVD, or any other type of chamber.

Figure 5:
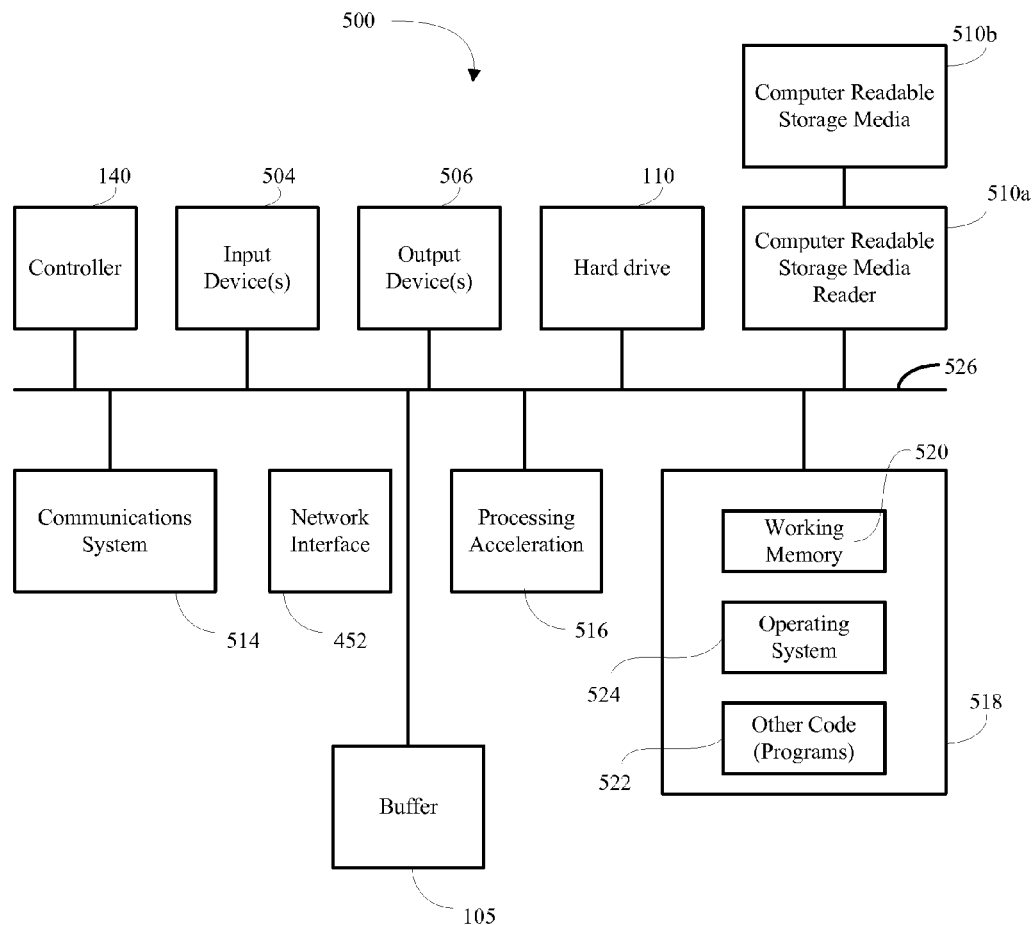
FIG. 5 shows a simplified block diagram of a computational system that can be used to implement embodiments of the invention.

The computer system 500, shown in FIG. 5 can be used to perform any of the embodiments of the invention. For example, computer system 500 can be used to execute method 200. As another example, sensor system 300 can include all or parts of computer system 500. As yet another example, computer system 500 can be used to perform any calculation, identification and/or determination described here. Computer system 500 includes hardware elements that can be electrically coupled via a bus 505 (or may otherwise be in communication, as appropriate).

Computer system 500 is shown having hardware elements that are electrically coupled via bus 526. Network interface 552 can communicatively couple the computational device 500 with another computer, for example, through a network such as the Internet. The hardware elements can include a controller 340, an input device 504, an output device 506, a hard drive 340, a computer-readable storage media reader 510a, a communications system 514, a processing acceleration unit 516 such as a DSP or special-purpose processor, and memory 518. The computer-readable storage media reader 510a can be further connected to a computer-readable storage medium 510b, the combination comprehensively representing remote, local, fixed, and/or removable storage devices plus storage media for temporarily and/or more permanently containing computer-readable information. Buffer 305 is coupled with bus 526.

Computer system 500 can also comprise software elements, shown as being currently located within working memory 520, including an operating system 524 and other code 522, such as a program designed to implement methods and/or processes described herein. In some embodiments, other code 522 can include software that provides instructions for receiving user input from a dual polarization radar system and manipulating the data according to various embodiments disclosed herein. In some embodiments, any software elements or code may be non-transitory. It will be apparent to those skilled in the art that substantial variations can be used in accordance with specific requirements. For example, customized hardware might also be used and/or particular elements might be implemented in hardware, software (including portable software, such as applets), or both. Further, connection to other computing devices such as network input/output devices can be employed.

The computational system 500 may further include (and/or be in communication with) one or more storage devices 525, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 500 might also include a communications subsystem 530, which can include without limitation a modem, a network card (wireless or wired), an infrared communication device, a wireless communication device and/or chipset (such as a Bluetooth device, an 802.6 device, a WiFi device, a WiMax device, cellular communication facilities, etc.), and/or the like. The communications subsystem 530 may permit data to be exchanged with a network (such as the network described below, to name one example), and/or any other devices described herein. In many embodiments, the computational system 500 will further include a working memory 535, which can include a RAM or ROM device, as described above.

The computational system 500 also can include software elements, shown as being currently located within the working memory 535, including an operating system 540 and/or other code, such as one or more application programs 545, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 525 described above.

In some cases, the storage medium might be incorporated within the computational system 500 or in communication with the computational system 500. In other embodiments, the storage medium might be separate from a computational system 500 (e.g., a removable medium, such as a compact disc, etc.), and/or provided in an installation package, such that the storage medium can be used to program a general purpose computer with the instructions/code stored thereon. These instructions might take the form of executable code, which is executable by the computational system 500 and/or might take the form of source and/or installable code, which, upon compilation and/or installation on the computational system 500 (e.g., using any of a variety of generally available compilers, installation programs, compression and/or decompression utilities, etc.) then takes the form of executable code.

Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A semiconductor processing system comprising:
a plurality of sensors that measure physical conditions of the semiconductor processing system;
a buffer electrically coupled with at least a subset of the plurality of sensors to store sensor data at a first sampling rate;
a long term storage device electrically coupled with the buffer to store data stored at the buffer and wherein the long term storage device has a second sampling rate that is less than the first sampling rate of the buffer; and
a controller electrically coupled to the buffer and the long term storage device, wherein the controller is configured to cause the sensor data stored at the buffer to be stored into the long term storage device at or below the second sampling rate that is less than the first sampling rate, and the controller is configured to, in response to a fault event, automatically output data stored in the long term storage device to a user.

2. The semiconductor processing system according to claim 1, wherein at least two of the plurality of sensors measure different physical conditions of the semiconductor processing system.

3. The semiconductor processing system according to claim 1, further comprising an analog to digital converter coupled between at least one sensor of the plurality of sensors and the buffer, the analog to digital converter configured to sample and convert sensor signals from the at least one sensor of the plurality of sensors into the sensor data.

4. The semiconductor processing system according to claim 1, wherein the buffer comprises a plurality of buffers.

5. The semiconductor processing system according to claim 1, wherein the buffer comprises RAM.

6. The semiconductor processing system according to claim 1, wherein the buffer stores the sensor data at a rate greater than 1 bit per microsecond.

7. The semiconductor processing system according to claim 1, wherein the buffer stores the sensor data at a rate greater than 100 bits per microsecond.

8. The semiconductor processing system according to claim 1, wherein the controller is further configured to format the sensor data before storing the sensor data stored at the buffer into the long term storage device.

9. The semiconductor processing system according to claim 1, wherein the controller is configured to store processing information associated with the sensor data when storing the sensor data stored at the buffer into the long term storage device, and wherein the processing information includes at least one of sensor information, processing system information, tool information, processing recipe information, fabrication information, processing location, or operator information.

10. The semiconductor processing system according to claim 1, wherein the long term storage device is configured to store a time stamp associated with the sensor data when storing the sensor data stored at the buffer.

11. A method for sensing environmental conditions in a semiconductor processing system, the method comprising:
storing sensor data in a buffer at a first sampling rate;
receiving a fault event; and
in response to receiving the fault event:
storing the sensor data stored in the buffer into a hard drive at a second sampling rate that is less than the first sampling rate; and
automatically outputting data stored in the hard drive to a user.

12. The method according to claim 11, further comprising receiving sensors data from at least two sensors that measure different physical conditions of the semiconductor processing system.

13. The method according to claim 11, further comprising sampling and converting sensor signals from at least one sensor of the plurality of sensors at the first sampling rate using an analog to digital converter coupled between the at least one sensor of the plurality of sensors and the buffer.

14. The method according to claim 11, wherein the buffer comprises a plurality of buffers.

15. The method according to claim 11, wherein the buffer comprises RAM.

16. The method according to claim 11, wherein sensor data is stored in the buffer at a sampling rate greater than 1 bit per microsecond.

17. The method according to claim 11, wherein sensor data is stored in the buffer at a sampling rate greater than 100 bits per microsecond.

18. The method according to claim 11, wherein the sensor data is stored into the hard drive with a time stamp or a processing information associated with the sensor data, and wherein the processing information includes at least one of sensor information, processing system information, tool information, processing recipe information, fabrication information, processing location, or operator information.

19. The method according to claim 11, further comprising:
    formatting the sensor data before storing the sensor data stored at the buffer into the hard drive.

20. The method according to claim 19, wherein formatting the sensor data includes at least one of fitting the sensor data within a table, formatting the sensor data to have a specific lengths in bits or bytes, marking the sensor data, assigning tags to the sensor data, or converting electrical signal values into temperature values.

* * * * *